United States Patent
Schmitz et al.

(10) Patent No.: US 7,157,349 B2
(45) Date of Patent: Jan. 2, 2007

(54) METHOD OF MANUFACTURING A SEMICONDUCTOR DEVICE WITH FIELD ISOLATION REGIONS CONSISTING OF GROOVES FILLED WITH ISOLATION MATERIAL

(75) Inventors: Jurriaan Schmitz, Hengelo (NL); Claire Ravit, Leuven (BE); Rita Victoire Theodosie Rooyackers, Leuven (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/529,962

(22) PCT Filed: Sep. 30, 2003

(86) PCT No.: PCT/IB03/04303

§ 371 (c)(1),
(2), (4) Date: Mar. 31, 2005

(87) PCT Pub. No.: WO2004/032226

PCT Pub. Date: Apr. 15, 2004

(65) Prior Publication Data

US 2006/0030118 A1  Feb. 9, 2006

(30) Foreign Application Priority Data

Oct. 3, 2002  (EP) .................................. 02079084

(51) Int. Cl.
*H01L 21/76* (2006.01)
(52) U.S. Cl. .................... 438/424; 257/19; 257/55; 257/63; 257/65; 257/E21.546
(58) Field of Classification Search .................. 257/63
See application file for complete search history.

(56) References Cited

U.S. PATENT DOCUMENTS

| 5,834,358 | A |   | 11/1998 | Pan et al. |
| 5,837,612 | A | * | 11/1998 | Ajuria et al. ................ 438/697 |
| 6,413,828 | B1 | * | 7/2002 | Lam ............................ 438/296 |
| 6,545,299 | B1 | * | 4/2003 | Peterson et al. ............. 257/183 |
| 2001/0029083 | A1 |  | 10/2001 | Chuang et al. |

* cited by examiner

*Primary Examiner*—Walter Lindsay, Jr.
*Assistant Examiner*—Cheung Lee
(74) *Attorney, Agent, or Firm*—Peter Zawilski

(57) ABSTRACT

A method of manufacturing a semiconductor device comprising a silicon body (1) having a surface (4) provided with field isolation regions (2) enclosing active regions (3). In this method, on the surface of the silicon body there is formed an auxiliary layer (5) of a material on which, during an oxidation treatment, a thicker layer of silicon oxide is formed than on the silicon of the silicon body. Here, an auxiliary layer comprising silicon and germanium is formed on the surface, said auxiliary layer preferably being a layer of $Si_xGe_{1-x-y}C_y$, where $0.70<x<0.95$ and $y<0.05$. Next, at the location of the field isolation regions to be formed, windows (9) are formed in the auxiliary layer and trenches (11) are formed in the silicon body. Next, on the walls (12) of the trenches, a silicon oxide layer (13) is provided and on the walls (10) of the windows a silicon oxide layer (14) is provided, both being formed by an oxidation treatment. The auxiliary layer is not oxidized throughout its thickness. After the oxidation treatment, a layer of insulating material (18) is deposited which fills the trenches and windows completely. Then, successively, a planarization treatment is carried out until the non-oxidized part of the auxiliary layer (17) is exposed, and the exposed part of the auxiliary layer is removed. Thus, field isolation regions (2) are formed having an edge (19) extending above the active regions (3).

11 Claims, 3 Drawing Sheets

Figure 1:
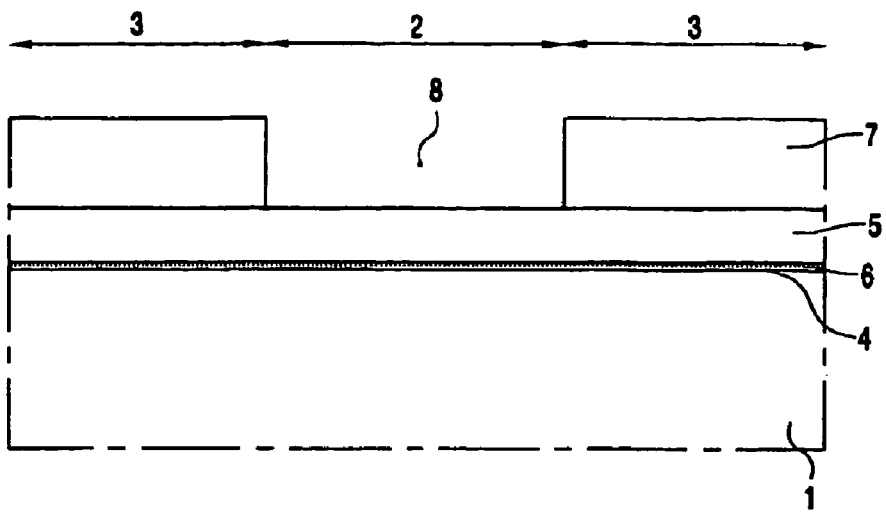

METHOD OF MANUFACTURING A SEMICONDUCTOR DEVICE WITH FIELD ISOLATION REGIONS CONSISTING OF GROOVES FILLED WITH ISOLATION MATERIAL

The invention relates to a method of manufacturing a semiconductor device, wherein a surface of a silicon body is provided with an auxiliary layer of a material on which, during an oxidation treatment, a thicker layer of silicon oxide is formed than on the silicon of the silicon body, after which, at the location of field isolation regions to be formed, windows are formed in the auxiliary layer and grooves are formed in the surface of the silicon body, whereafter an oxidation treatment is carried out wherein the walls of the grooves and of the windows are provided with a layer of silicon oxide, but wherein it is precluded that the auxiliary layer adjacent to the windows is oxidized across the entire thickness, after which, successively, a layer of isolating material is deposited in a thickness such that the grooves and the windows are filled completely, a planarization treatment is carried out until the non-oxidized part of the auxiliary layer is exposed, and the non-oxidized part of the auxiliary layer is removed.

During the oxidation treatment, for example by heating the silicon body in an oxidizing atmosphere, the wall of the windows is provided with a layer of silicon oxide that is thicker than that formed on the wall of the grooves. Thus, next to the grooves, the layer of silicon oxide formed on the wall of the windows projects above the non-oxidized silicon of the silicon body. This isolating edge is removed over only a part of its thickness during the planarization treatment and during the etching away of the non-oxidized part of the auxiliary layer, as a result of which field isolation regions are formed whose isolating edge next to the grooves projects above the silicon of the silicon body next to the grooves. Thus, field isolation regions are formed having an isolating edge that projects above the active regions enclosed by field isolation regions.

After the field isolation regions have been provided in the silicon body, semiconductor elements having, inter alia, shallow pn-junctions extending parallel to the surface are formed in the active regions. During these further treatments, etch and cleaning processes are carried out wherein silicon oxide is etched away. If the field isolation regions were not provided with said edges, then the active regions could become exposed at the interface with the field isolation regions as a result of said etching away of silicon oxide. As a result, the shallow pn-junctions would no longer be isolated. This is precluded by the edges formed at the field isolation regions, which edges overlap the active regions.

U.S. Pat. No. 5,834,358 discloses a method of the type mentioned in the opening paragraph, wherein the surface of the silicon body is provided with a layer comprising $10^{19}$ to $10^{21}$ atoms per cc of comparatively heavily doped low-amorphous or polycrystalline silicon, which layer serves as an auxiliary layer. The doping may be p-type or n-type. The silicon body wherein the grooves are formed is lightly p-type doped with approximately $10^{16}$ atoms per cc. During oxidation, the comparatively heavily doped polycrystalline silicon is provided with a layer of silicon oxide that is thicker than that formed on the comparatively lightly doped monocrystalline silicon of the silicon body. The oxidation treatment is carried out at a temperature in the range of 800 to 950° C. in oxygen. A layer of silicon oxide is deposited as the isolating material. After the planarization treatment and removal of the non-oxidized part of the auxiliary layer of polycrystalline silicon, field isolation regions are formed having an edge that projects 20 to 50 nm above the active regions enclosed by field oxide.

The use of the comparatively heavily doped polycrystalline silicon as the material for the auxiliary layer has the drawback that, during the oxidation treatment, atoms of the dopant, such as phosphor or boron, may issue from the auxiliary layer and find their way into the grooves in the silicon body. During oxidation of the walls of the grooves, these atoms are then bound to each other in the interface between silicon oxide and the walls of the grooves. As a result, the isolating properties of the field isolation regions may be adversely affected.

It is an object of the invention to provide, inter alia, a method which does not have said drawback. To achieve this, the method in accordance with the invention is characterized in that a layer comprising silicon and germanium is applied as an auxiliary layer to the surface of the silicon body. During the oxidation treatment the silicon body is heated in a reaction chamber in an oxidizing gas, and silicon oxide and germanium oxide are formed during the oxidation of the auxiliary layer. The first oxide is stable, the second oxide evaporates in the reaction chamber. A layer of silicon oxide is formed on the walls of the windows in the auxiliary layer as well as on the walls of the grooves, the formation of silicon oxide on the walls of the windows in the auxiliary layer comprising silicon and germanium taking place more rapidly than the formation of silicon oxide on the silicon of the walls of the grooves. As there is no dopant in the auxiliary layer, there is no risk that undesired atoms of a dopant are bound in the interface between silicon oxide and the walls of the grooves. The possible presence of germanium on the walls of the grooves has no influence on the isolating properties of the field isolation regions.

Preferably, on the surface of the silicon body a layer of $Si_xGe_{1-x-y}C_y$, where $0.70<x<0.95$ and $y<0.05$, is provided as the auxiliary layer. Such a layer is stable at very high temperatures in the range of 1000 to 1100° C. As a result, the desired layer of silicon oxide can be provided on the walls of the windows in the auxiliary layer and on the walls of the grooves at said very high temperatures. The oxidation treatment at such a high temperature can be carried out in a very short period of time.

During the oxidation treatment, wherein the walls of the grooves and of the windows are provided with a layer of oxide, it must be precluded that the auxiliary layer next to the windows is oxidized throughout its thickness. This can be readily achieved by applying the auxiliary layer in a sufficiently large thickness. This can also be achieved through an additional process step wherein a layer of silicon nitride is applied to the auxiliary layer, the windows being formed in the layer of silicon nitride as well as in the auxiliary layer. In this case, during the oxidation treatment the auxiliary layer is protected at the upper side by the layer of silicon nitride that is hardly subject to oxidation. The auxiliary layer is then provided with an oxide layer only at the location of the wall of the windows. The layer of silicon nitride has the additional advantage that it can be used as a stop layer during the planarization treatment. In order to be able to remove the non-oxidized part of the auxiliary layer, however, the layer of silicon nitride has to be removed first.

In order to be able to readily remove the non-oxidized part of the auxiliary layer from the surface, preferably prior to applying the auxiliary layer to the surface of the silicon body, said surface is provided with a layer of silicon oxide, and the windows are also formed in this layer. The auxiliary layer with silicon and germanium can be selectively etched from the layer of silicon oxide, so that damage to the surface of the silicon body by etching can be precluded.

These and other aspects of the invention are apparent from and will be elucidated with reference to the embodiment(s) described hereinafter.

In the drawings:

FIGS. 1 through 8 are diagrammatic, cross-sectional views of several stages in the manufacture of a semiconductor body by means of a first example of the method in accordance with the invention, and FIGS. 9 through 12 are diagrammatic, cross-sectional views of several stages in the manufacture of a semiconductor device by means of a second example of the method in accordance with the invention.

FIGS. 1 through 8 are diagrammatic, cross-sectional views of several stages in the manufacture of a semiconductor device, wherein, in a silicon body 1, field isolation regions 2 are formed that enclose active semiconductor regions 3. In a first example of this method, a surface 4 of the silicon body 1 is provided with a 100 to 200 nm thick auxiliary layer 5. This auxiliary layer 5 is of a material on which, during oxidation, a thicker layer of silicon oxide is formed than on the silicon of the silicon body. In this example, an approximately 5 to 15 nm thick layer of silicon oxide 6 is provided between the auxiliary layer 5 and the surface.

Figure 2:
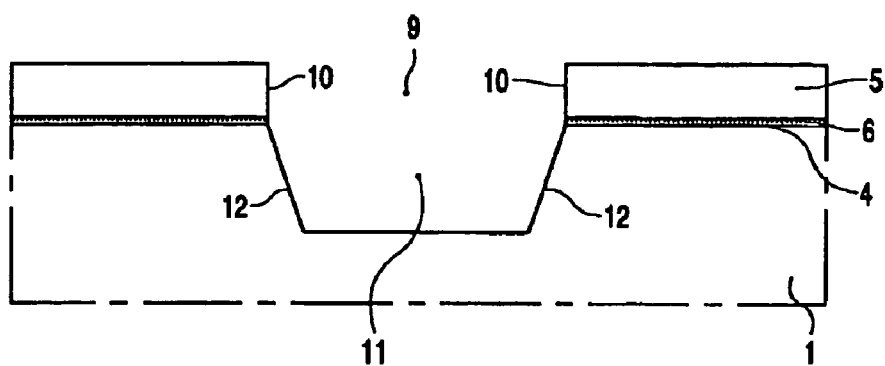

On the auxiliary layer 5, a photoresist mask 7 having apertures 8 is formed in a customary manner, which apertures leave the auxiliary layer 5 exposed at the location of the field isolation regions 2 to be formed. Subsequently, as shown in FIG. 2, windows 9 are formed in the auxiliary layer 5, which comprise walls 10 extending transversely to the surface 4, and grooves 11 with walls 12 are formed in the surface 4 of the silicon body 1. If necessary, the photoresist mask 7 can be removed after the formation of the windows 9 in the auxiliary layer 5, whereafter the grooves 11 are etched using the auxiliary layer 5 as a mask. Preferably, the photoresist mask 7 is used, however, to form the windows 9 in the auxiliary layer 5 as well as the grooves 11 in the surface 4 of the silicon body 1 by means of a customary anisotropic etching treatment.

Figure 3:
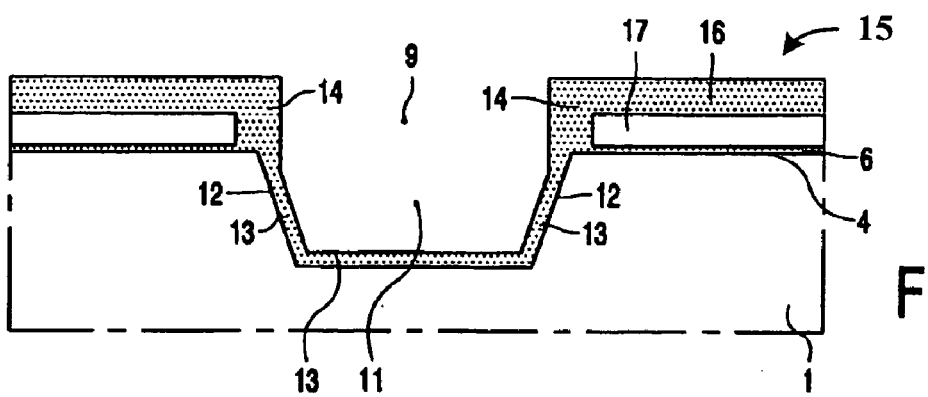

After the grooves 11 have been etched, an oxidation treatment is carried out wherein the silicon body is heated in an oxidizing gas mixture. In this oxidation treatment, as shown in FIG. 3, the walls 12 of the grooves 11 and the walls 10 of the windows 9 are provided with a layer of silicon oxide, i.e. the walls 12 of the grooves 11 are provided with a layer 13, the walls 10 of the windows 9 are provided with a layer 14. In the oxidation treatment, the auxiliary layer 5 is also provided, in this example, with a layer of silicon oxide 16 at the upper side 15. The auxiliary layer 5 is not converted to silicon oxide throughout its thickness; a layer 17 of the auxiliary layer remains.

Figure 4:
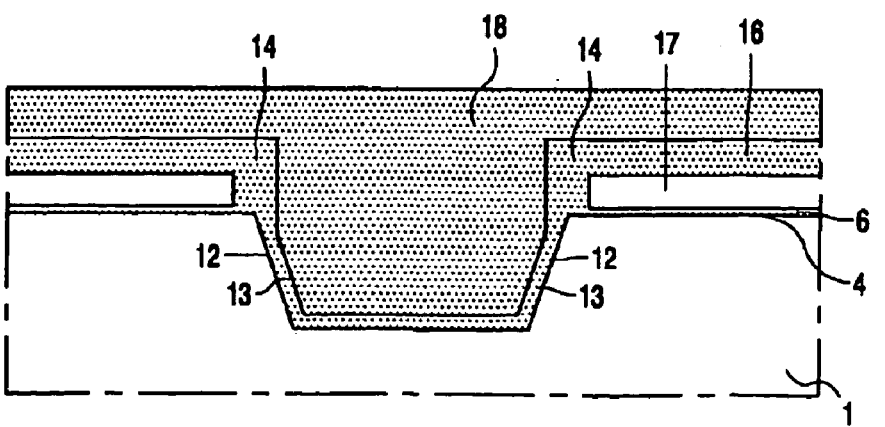
Figure 5:
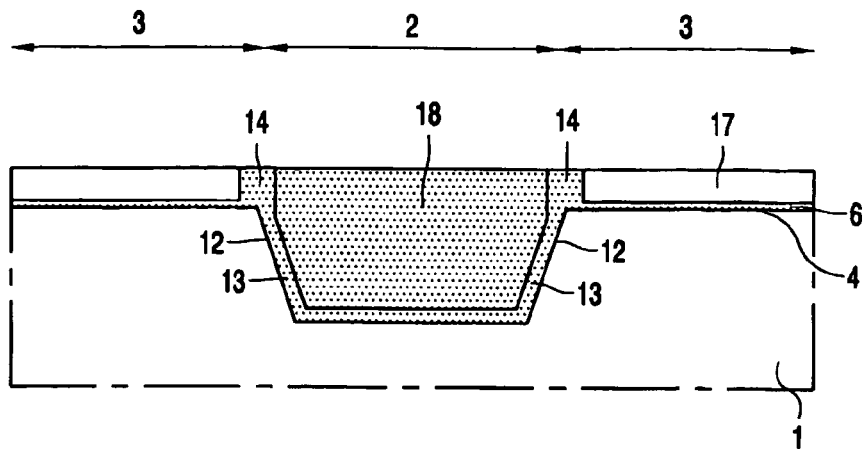

As shown in FIG. 4, a layer of isolating material 18, in this example a layer of silicon oxide, is deposited in a thickness such that the grooves 11 and the windows 9 are filled completely. Subsequently, as shown in FIG. 5, a customary planarization treatment is carried out until the non-oxidized part of the auxiliary layer 17 is exposed. This part 17 is finally removed, as shown in FIG. 6.

Figure 6:
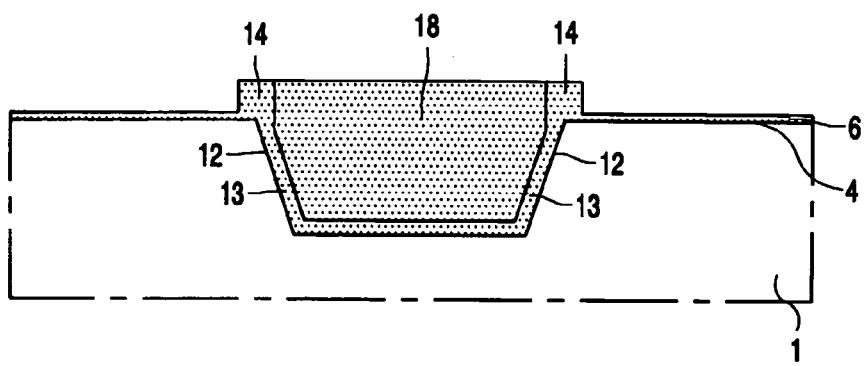
Figure 7:
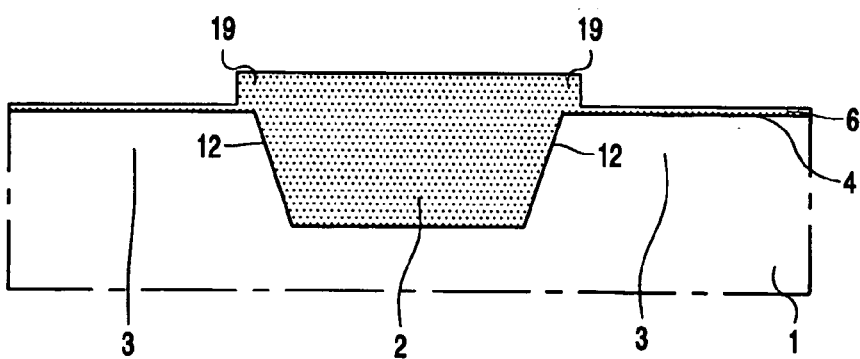
Figure 8:
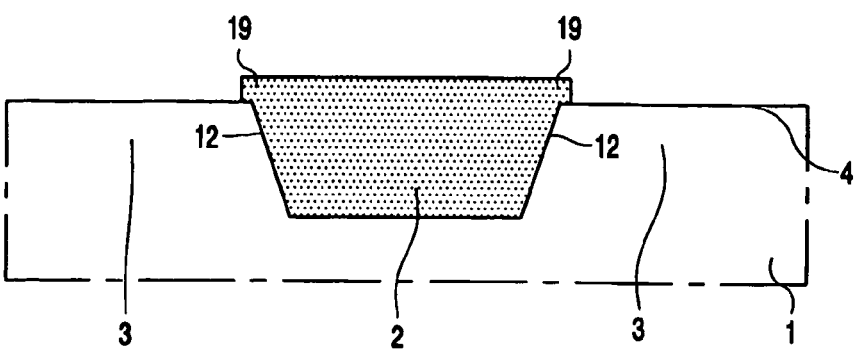

In FIG. 7, the same situation is shown as in FIG. 6, but layers 13 and 18 are no longer shown individually. In this example both are made of silicon oxide. Finally, in FIG. 8, wherein the same situation is shown as in FIG. 7, a short customary etch treatment is carried out to remove the layer of silicon oxide 6 from the surface 4. As is shown in the Figure, an edge 19 of the field isolation region 2 projects above the active regions 3.

After the field isolation regions 2 have been formed in the silicon body 1, semiconductor elements (not shown) are formed in the active regions 3, said semiconductor elements having, inter alia, shallow pn-junctions which extend parallel to the surface 4. During these further operations, etching and cleaning processing are carried out wherein silicon oxide is formed and etched away. If the field isolation regions were not provided with the edges 19, then the active regions 3 could be exposed at their interface with the field isolation regions 2 by said operations. As a result, the shallow pn-junctions would no longer be isolated.

In this example, the surface 4 of the silicon body 1 is provided with an auxiliary layer 5 in the form of an approximately 100 to 200 nm thick layer comprising silicon and germanium. During the oxidation treatment the silicon body is heated in a reaction chamber to a temperature in the range of 1050 to 1160° C. in an oxygen-containing gas mixture for approximately 30 seconds, and silicon oxide and germanium oxide are formed during the oxidation of the auxiliary layer 5. The first oxide is stable, the second oxide evaporates in the reaction chamber. A layer of silicon oxide is formed on the walls 10 of the windows 9 in the auxiliary layer 5 as well as on the walls 12 of the grooves 11, the formation of silicon oxide on the walls 10 of the windows 9 in the auxiliary layer 5 comprising silicon and germanium occurring at a higher rate than the formation of silicon oxide on the silicon of the walls 12 of the grooves 11. As the auxiliary layer 5 does not contain a dopant, there is no risk that undesired atoms of a dopant are bound in the interface between the layer of silicon oxide 13 and the walls 12 of the grooves 11. The possible presence of germanium on the walls of the grooves does not influence the isolating properties of the field isolation regions 2.

Preferably, the surface 4 of the silicon layer 1 is provided with an auxiliary layer 5 in the form of a layer of $Si_xGe_{1-x-y}C_y$, where $0.70<x<0.95$ and $y<0.05$. Such a layer is stable at very high temperatures in the range of 1000 to 1100° C. As a result, the desired layer of silicon oxide 14 can be formed on the walls 10 of the windows 9 and the layer of silicon oxide 13 can be formed on the walls 12 of the grooves 11 at said very high temperatures. The oxidation treatment at such a high temperature can be carried out in a very short period of time, in this example approximately 30 seconds. The edge 19 shown in FIG. 8 then projects approximately 10 to 30 nm above the active regions 3.

In the example described herein, oxidation of the auxiliary layer 5 throughout its thickness was readily precluded in that said layer was provided in a sufficient thickness. The planarization treatment of the isolating layers 18 is interrupted when the non-oxidized part of the auxiliary layer 17 is exposed.

Figure 9:
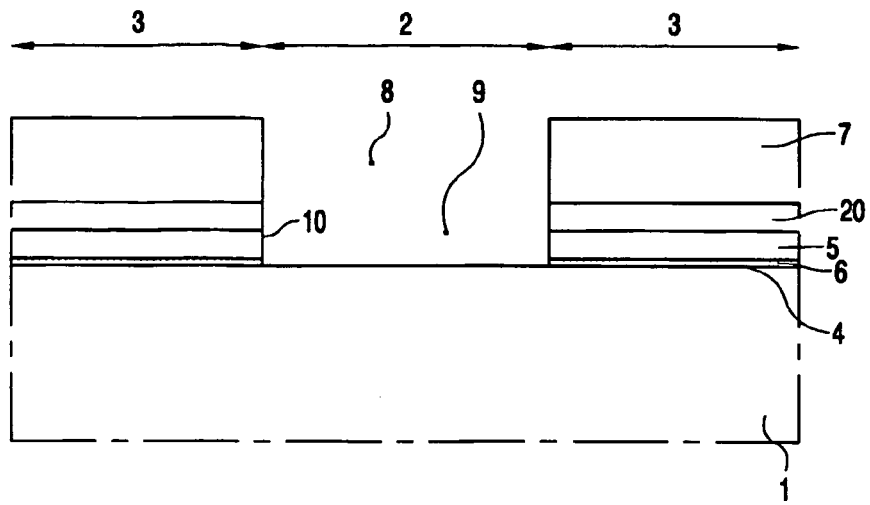

In the example of the method shown in FIGS. 9 through 12, an approximately 50 nm thick layer of silicon nitride 20, as shown in FIG. 9, is applied to the auxiliary layer 5 having a thickness in this case of approximately 50 nm. The windows 9 are formed in the layer of silicon nitride 20 as well as in the auxiliary layer 5. As a result, during the oxidation treatment the auxiliary layer 5 is protected at the upper side by the layer of silicon nitride 20 which is hardly subject to oxidation. The auxiliary layer is then provided with a silicon oxide layer 14 only at the location of the wall 10 of the windows 9.

Figure 10:
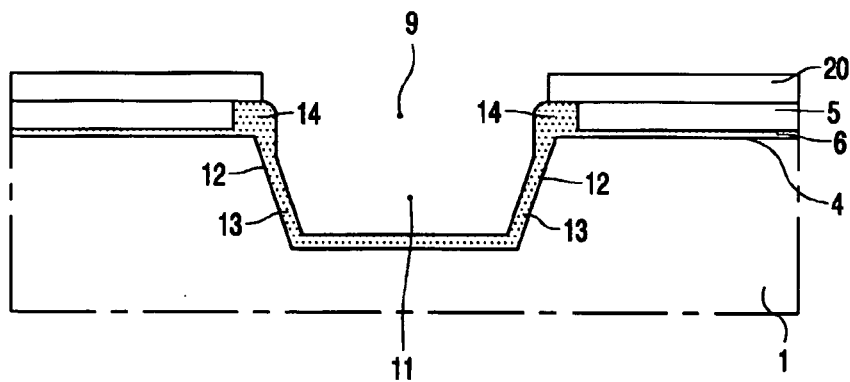
Figure 11:
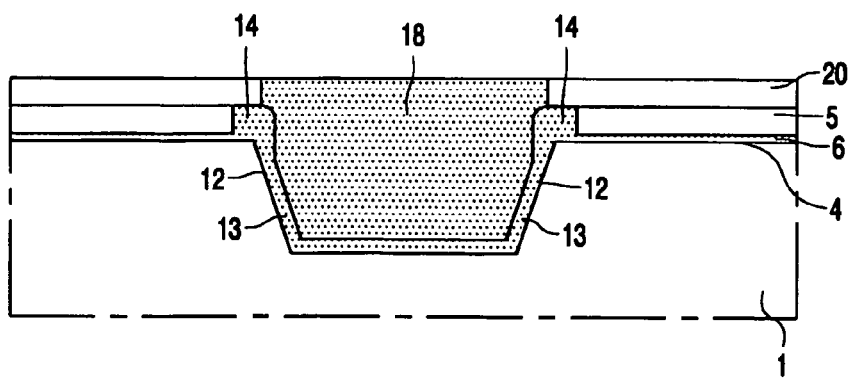
Figure 12:
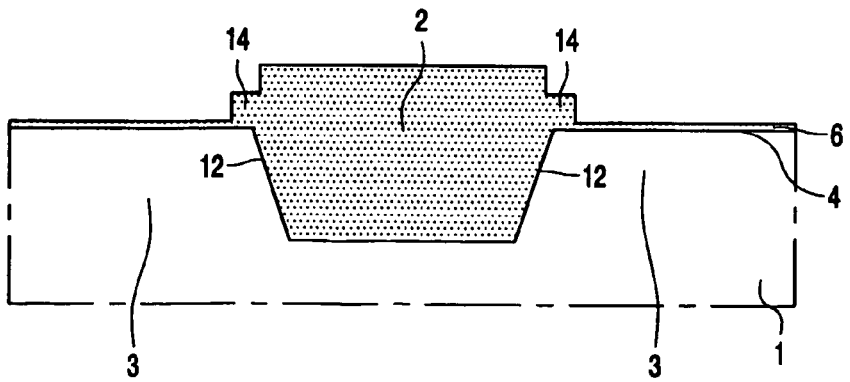

FIG. 10 shows the situation where a layer of silicon oxide 14 is applied to the walls 10 of the windows 9, and a layer of silicon oxide 13 is applied to the walls 12 of the grooves 11. FIG. 11 shows the situation after planarization of the layer of isolating material 18. In this example, the layer of silicon nitride 20 is used as a stop layer during the planarization treatment. After the planarization treatment, the layer of silicon nitride 20 is removed in a customary etch bath containing phosphoric acid, and subsequently the subjacent auxiliary layer 5 is removed in a customary etch bath containing nitric acid and hydrogen fluoride. FIG. 12 shows the structure thus formed, wherein the individual layers of silicon oxide 13, 14 and 18 are no longer shown.

As is indicated in both examples, the auxiliary layer 5 was applied to an approximately 5 to 15 nm thick layer of silicon oxide 6. As a result, the non-oxidized part of the auxiliary layer 17 can be readily removed from the surface 4. The auxiliary layer 5 can be selectively etched away from the silicon oxide layer 6 using a customary etch bath with nitric acid and hydrogen fluoride. As a result, damage to the surface 4 of the silicon body 1 by etching is precluded.

The invention claimed is:

1. A method of manufacturing a semiconductor device, the method comprising:
    applying an auxiliary layer comprising non-doped silicon and germanium to a surface of a silicon body wherein, during an oxidation treatment, a thicker layer of silicon oxide is formed on the auxiliary layer than is formed on the surface of the silicon body;
    at the location of field isolation regions to be formed, forming windows in the auxiliary layer and grooves in the surface of the silicon body;
    carrying out an oxidation treatment to provide the walls of the grooves and of the windows respectively of the silicon body and the auxiliary layer with a layer of silicon oxide, the silicon oxide on the auxiliary layer being thicker than the silicon oxide on the silicon body;
    but wherein it is precluded that the auxiliary layer adjacent to the windows is oxidized across the entire thickness;
    after which, successively, a layer of isolating material is deposited in a thickness such that the grooves and the windows arc filled completely; and
    carrying out a planarization treatment until the non-oxidized part of the auxiliary layer is exposed, after which this part of the auxiliary layer is removed.

2. A method as claimed in claim 1, characterized in that on the surface of the silicon body a layer of $Si_xGe_{1-x-y}C_y$, where $0.70<x<0.95$ and $y<0.05$, is provided as the auxiliary layer.

3. A method as claimed in claim 2, characterized in that the auxiliary layer is applied in a thickness such tat this layer is not converted across the entire thickness into an oxide during the oxidation treatment.

4. A method as claimed in claim 2, characterized in that a layer of silicon nitride is applied to the auxiliary layer, the windows being funned in the layer of silicon nitride as well as in the auxiliary layer.

5. A method as claimed in claim 2, characterized in that prior to applying the auxiliary layer to the surface of the silicon body, this surface is provided with a layer of silicon oxide, and the windows are also formed in the layer of silicon oxide.

6. A method as claimed in claim 1, characterized in that the auxiliary layer is applied in a thickness such that this layer is not converted across the entire thickness into an oxide during the oxidation treatment.

7. A method as claimed in claim 6, characterized in that prior to applying the auxiliary layer to the surface of the silicon body, this surface is provided with a layer of silicon oxide, and the windows are also formed in the layer of silicon oxide.

8. A method as claimed in claim 1, characterized in that a layer of silicon nitride is applied to the auxiliary layer, the windows being formed in the layer of silicon nitride as well as in the auxiliary layer.

9. A method as claimed in claim 8, characterized in that prior to applying the auxiliary layer tote surface of the silicon body, this surface is provided with a layer of silicon oxide, and the windows are also formed in the layer of silicon oxide.

10. A method an claimed in claim 1, characterized in that prior to applying the auxiliary layer to the surface of the silicon body, this surface is provided with a layer of silicon oxide, and the windows are also formed in the layer in silicon oxide.

11. A method of manufacturing a semiconductor device, the method comprising:
    applying a non-doped auxiliary layer comprising silicon and germanium to a substrate including silicon, the non-doped auxiliary layer having oxidation characteristics that facilitate thicker oxide growth, relative to oxide growth on the substrate;
    forming an opening having walls extending through the auxiliary layer and into a silicon body;
    oxidizing the auxiliary layer and the silicon body at the walls of the opening to form a layer of silicon oxide on the auxiliary layer that is thicker than a silicon oxide layer on the silicon body, wherein the auxiliary layer adjacent to the wall is not oxidized across its entire thickness;
    depositing a layer of isolating material on the layer of silicon oxide to fill the opening;
    planarizing the semiconductor device to expose a non-oxidized part of the auxiliary layer; and
    after planarization, removing the non-oxided part of the auxiliary layer.

* * * * *